(12) United States Patent
Wang et al.

(10) Patent No.: US 7,292,083 B1
(45) Date of Patent: Nov. 6, 2007

(54) COMPARATOR CIRCUIT WITH SCHMITT TRIGGER HYSTERESIS CHARACTER

(75) Inventors: Ming Hung Wang, Hsinchu (TW); Yen-An Chang, TouFen Town, Miaoli Country (TW)

(73) Assignee: Etron Technology, Inc., Hsin-Chu (TW)

( * ) Notice: Subject to any disclaimer, the term of this patent is extended or adjusted under 35 U.S.C. 154(b) by 39 days.

(21) Appl. No.: 11/406,464

(22) Filed: Apr. 18, 2006

(51) Int. Cl.
*H03K 3/12* (2006.01)

(52) U.S. Cl. .......................... 327/205; 327/63; 327/64; 327/65; 327/66; 327/67; 327/68; 327/52; 327/53; 327/90; 327/77

(58) Field of Classification Search ...................... None
See application file for complete search history.

(56) References Cited

U.S. PATENT DOCUMENTS

| | | | | |
|---|---|---|---|---|
| 5,313,114 A | * | 5/1994 | Poletto et al. ................ | 327/65 |
| 5,424,663 A | * | 6/1995 | Wong ........................... | 327/65 |
| 5,446,396 A | * | 8/1995 | Brehmer ....................... | 327/66 |
| 5,880,611 A | * | 3/1999 | Danstrom ..................... | 327/142 |
| 5,894,234 A | * | 4/1999 | Morris ......................... | 327/65 |
| 5,945,852 A | * | 8/1999 | Kosiec ......................... | 327/68 |
| 6,208,187 B1 | * | 3/2001 | Callahan, Jr. ................ | 327/206 |
| 6,362,467 B1 | | 3/2002 | Bray ........................ | 250/214 A |
| 6,366,136 B1 | | 4/2002 | Page ........................... | 327/53 |
| 6,459,306 B1 | | 10/2002 | Fischer et al. ................ | 327/67 |
| 6,583,661 B1 | * | 6/2003 | Tanji et al. .................. | 327/355 |
| 6,741,112 B2 | * | 5/2004 | Ajit ............................. | 327/205 |
| 6,894,542 B2 | * | 5/2005 | Prexl et al. ................... | 327/67 |
| 2006/0012405 A1 | * | 1/2006 | Martins ....................... | 327/77 |

\* cited by examiner

*Primary Examiner*—Tuan T. Lam
*Assistant Examiner*—Hiep Nguyen
(74) *Attorney, Agent, or Firm*—Saile Ackerman LLC; Stephen B. Ackerman

(57) ABSTRACT

A circuit and a method are provided to produce a novel comparator with Schmitt trigger hysteresis character. The circuit includes a current source which controls the magnitude of current flow through this comparator circuit. It has a first logic device which is turned ON by a reference voltage, and a second logic device is turned ON by a comparator input voltage. A first feedback device is turned ON by a negative comparator output. A first parallel resistor is connected in parallel to the first feedback device. A second feedback device is turned ON by a positive comparator output. A second parallel resistor is connected in parallel to the second feedback device. The first and second parallel resistors are used to provide the differential comparator with switching voltage offsets which result in the Schmitt trigger hysteresis character.

26 Claims, 4 Drawing Sheets

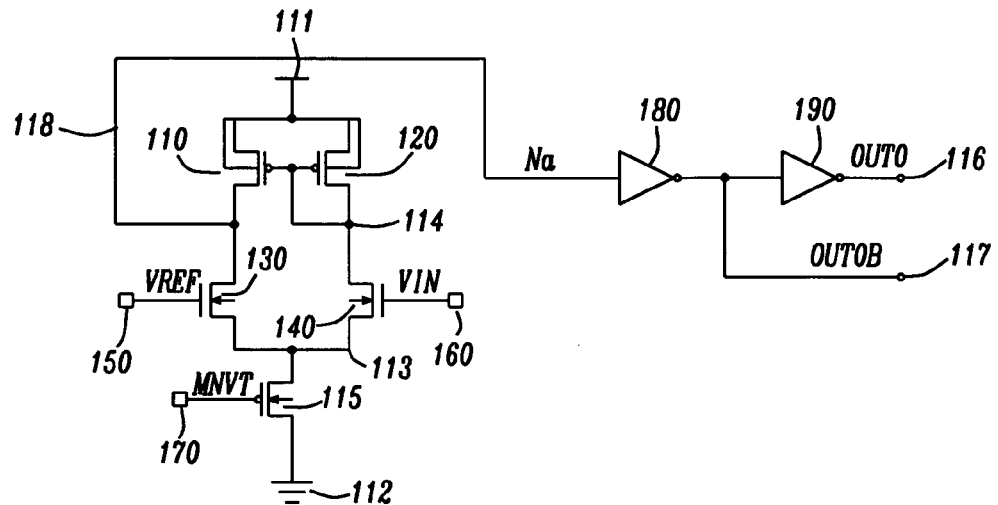
*FIG. 1a – Prior Art*
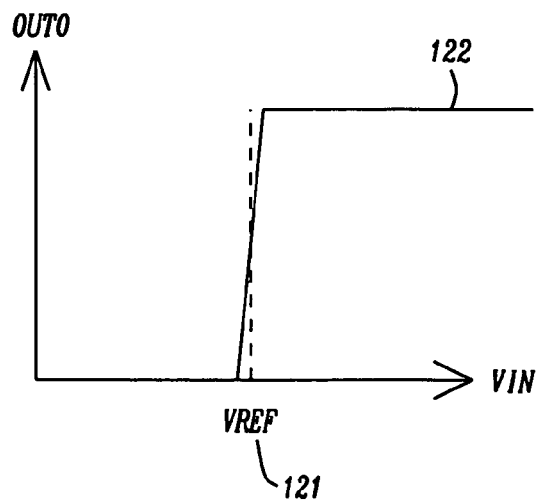
*FIG. 1b – Prior Art*

COMPARATOR CIRCUIT WITH SCHMITT TRIGGER HYSTERESIS CHARACTER

BACKGROUND OF THE INVENTION

1. Field of the Invention

The present invention generally relates to comparator circuits. More particularly, this invention relates to a circuit and a method for differential comparators with hysteresis.

2. Description of the Prior Art

FIG. 1 shows a prior art comparator circuit without hysteresis. It is a simple operational amplifier (op amp). The figure shows a differential comparator circuit. Devices 110 and 120 are p-channel metal oxide semiconductor field effect transistors (PMOS FETs). They are load devices with their sources and substrates connected to the power supply node 111. The gates of devices 110 and 120 are connected in common to the rain 114 of device 120. The drain 118 of device 110 drives inverter 180. The output of inverter 180 is node Out 0B (117). The output of inverter 180 feeds inverter 190, whose output is Out0 (116). N-channel metal oxide semiconductor field effect transistors (NMOSFETs) 130 and 140 are the logic devices for the differential amplifier. The gate of device 130 is connected to a reference voltage, VREF, 150. The drain of device 130 is connected to node 118. The gate of device 140 is connected to an input voltage, VIN 160. The drain of device 140 is connected to node 114. The sources of devices 130 and 140 are connected in common to the drain 113 of NMOS FET device 115. Device 115 is a current source whose current is specified by its device size and gate voltage, MNVT 170. The source of device 115 is connected to ground 112.

FIG. 1b shows a transfer function plot 122 with VIN vs. OUT0. Increasing VIN from zero, the output of the differential Op amp remains zero until VIN approaches VREF121. As VIN approaches VREF, Out0 begins to increase from zero. Out0 continues to increase until VIN is slightly above VREF. Then, Out0 stops increasing and remains constant at a HIGH level.

Similarly, in FIG. 1b as VIN decreases from some voltage level above VREF, Out0 remains at a constant HIGH level. As VIN decreases and approaches VREF, Out0 decreases. Out0 decreases to zero as VIN decreases to a voltage value just below VREF. Then, as VIN decreases toward zero, Out0 remains constant at zero volts as shown in FIG. 1b. As we see from this description, the comparator circuit of FIG. 1a does not have hysteresis.

A problem with comparator circuits, which do not have hysteresis, is that they are poor for measuring temperatures or other quantities, which have alternating fluctuation.

U.S. Pat. No. 6,459,306 B1 (Fischer et al.) describes a low power differential comparator with stable hysteresis. The input stage bias is used for both setting a bias level and for setting the hysteresis level of the differential comparator circuit. This multiple use of the input stage bias helps to reduce the overall current and power requirements while maintaining full operating speed.

U.S. Pat. No. 6,366,136 B1 (Page) discloses a voltage comparator with hysteresis that includes a differential amplifier, voltage divider circuits and a current mirror. The input terminals of the two differential amplifier circuit branches are biased at unequal potentials by the voltage divider circuits. The output of the current mirror circuit can be implemented to include multiple branches which are selectively connectable. This allows the user to selectively vary the amount of hysteresis as a function of the differences in the input signal voltage necessary to cause the conducting differential amplifier circuit branches to alternate.

U.S. Pat. No. 6,362,467 B1 (Bray) describes a fast-switching comparator with hysteresis. Fast switching is achieved in the comparator by driving the comparator stage with a gain amplifier and feeding back the output signal from the comparator to the gain amplifier.

SUMMARY OF THE INVENTION

It is therefore an object of the present invention to provide a circuit and a method for providing a circuit and a method for differential comparators with hysteresis.

The objects of this invention are achieved by a differential comparator circuit with hysteresis. This circuit contains a current source which controls the magnitude of current flow through this comparator circuit. The circuit also has a first logic device which is turned ON by a reference voltage, and which when ON feeds current to the current source. A second logic device is turned ON by a comparator input voltage, and which when ON allows current to flow to the current source. A first feedback device is turned ON by a negative comparator output. A first parallel resistor is connected in parallel to the first feedback device. A second feedback device is turned ON by a positive comparator output. A second parallel resistor is connected in parallel to the second feedback device. A first load device is connected to the first feedback device. A second load device is connected to the second feedback device. The first and second parallel resistors are used to provide the differential comparator with switching voltage offsets which result in the Schmitt trigger hysteresis character.

The above and other objects, features and advantages of the present invention will be better understood from the following detailed description taken in conjunction with the accompanying drawings.

BRIEF DESCRIPTION OF THE DRAWINGS

FIG. 1a is a prior art differential comparator circuit without hysteresis.

FIG. 1b shows a prior art input vs. output transfer graph for the circuit of FIG. 1a.

FIG. 2b shows an input vs. output transfer graph for the circuit of FIG. 2a.

FIG. 4 shows the hysteresis results of a computer simulation of the circuit shown in FIG. 2a.

DESCRIPTION OF THE PREFERRED EMBODIMENT

Figure 2A:
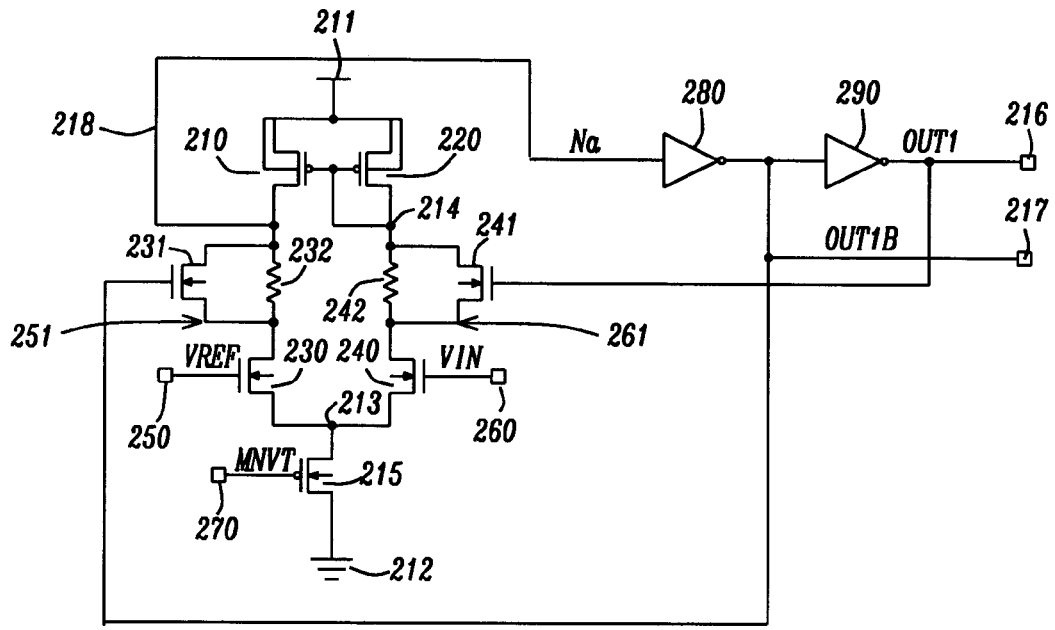
FIG. 2a shows a differential comparator circuit with hysteresis, which represents a first embodiment of this invention.

FIG. 2a shows the main embodiment of the comparator circuit of this invention. It is a differential comparator with hysteresis. Devices 210 and 220 are p-channel metal oxide semi-conductor field effect transistors (PMOS FETs). They are load devices with their sources and substrates connected to the power supply mode 211. The gates of devices 210 and 220 are connected in common to the drain 214 of device 220. The drain 218 of device 210 drives inverter 280. The output of inverter 280 is node OUT 1B (217). The output of inverter 280 feeds inverter 290, whose output is OUT1 (216). N-channel metal oxide semi conductor field effect transistors (NMOS FETs) 230 and 240 are the logic devices for the differential amplifier. The gate of device 230 is connected to a reference voltage, VREF, 250. The drain of device 230 is connected to node 251. The gate of 240 is connected to an input voltage, VIN 260. The drain of device 240 is connected to node 261. The sources of devices 230 and 240 are connected in common to the drain 213 of NMOS FET device 215. Device 215 is a current source whose current is specified by its device size and its gate voltage, MNVT 270. The source of device 215 is connected to ground 212.

In FIG. 2a, NMOS FET device 231 has its drain connected to one side of 10K, resistor 232 at node 213. Device 231 has its source connected to the other side of 10K resistor 232 at node 251. The gate of device 231 is connected to node 217, which is the OUT 1B signal. NMOS FET device 241 has its drain connected to one side of 10K resistor 242 at node 214. Device 241 has its source connected to the other side of 10K resistor 242 at node 261. The gate of device 241 is connected to node 216, which is the OUT1 signal.

Figure 2B:
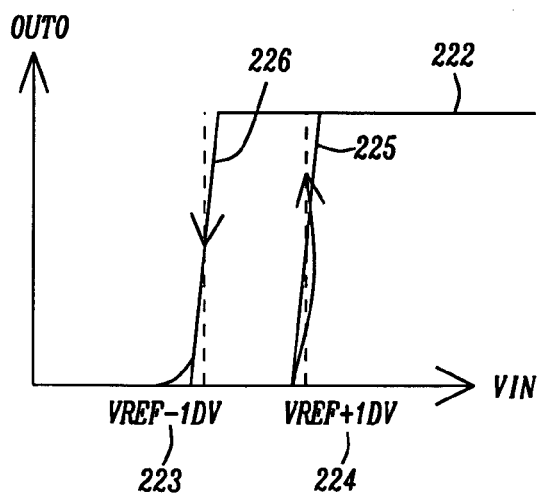

FIG. 2b shows transfer function plot 222 with VIN vs. OUT1. Increasing VIN from zero, the output of the differential op any remains zero until VIN approaches VREF+dV (224). As VIN approaches VREF+dV (224), OUT1 begins to increase from zero. OUT1 continues to increase until VIN is slightly above VREF+dV (224). Then, OUT1 stops increasing and remains constant at a HIGH level.

Similarly, in FIG. 2b, as VIN decreases from some voltage level above VREF, OUT1 remains at a constant HIGH level. As VIN decreases and approaches VREF−dV (223), OUT1 decreases. OUT1 decreases to zero as VIN decreases to a voltage value just below VREF−dv (223). Then, as VIN decreases toward zero, OUT1 remains constant at zero volts as shown in FIG. 2b. This behavior shown in FIG. 2b demonstrates hysteresis.

The circuitry of FIG. 2a produces hysteresis. Initially, devices 230 and 231 are ON, causing node 213 to be LOW. Consequently, node OUT 1B would be HIGH at the output of inverter 280. Initially, node OUT1 (216) would be LOW as shown in the transfer graph in FIG. 2b. As seen in FIG. 2a, as VIN 260 increases toward VREF+dV, device 240 turns ON more fully. When VIN equals VREF+dV, the op amp comparator switches causing node 213 to go HIGH, OUT 1B (217) to go LOW and OUT1 (216) to go HIGH 225 as shown in the transfer plot 222 of FIG. 2b. Since OUT1 is HIGH, device 241 turns ON. When this happens, current is diverted from resistor 242. When VIN decreases, node OUT1 remains HIGH and OUT 1B remains LOW. Since OUT 1B is LOW, device 231 remains OFF, and current flows through resistor 232. The voltage drop across a resistor 232 is dV. When the voltage on VIN approaches VREF−dV, the comparator begins to switch again. When VIN equals VREF−dV, the comparator switches causing node 213 to go LOW, OUT 1B (217) to go HIGH, and OUT1 (216) to go LOW 226 as shown in the transfer graph 222 of FIG. 2b. Since OUT1 is LOW, device 241 turns OFF. This allows current flow through parallel resistor 242.

Figure 2C:
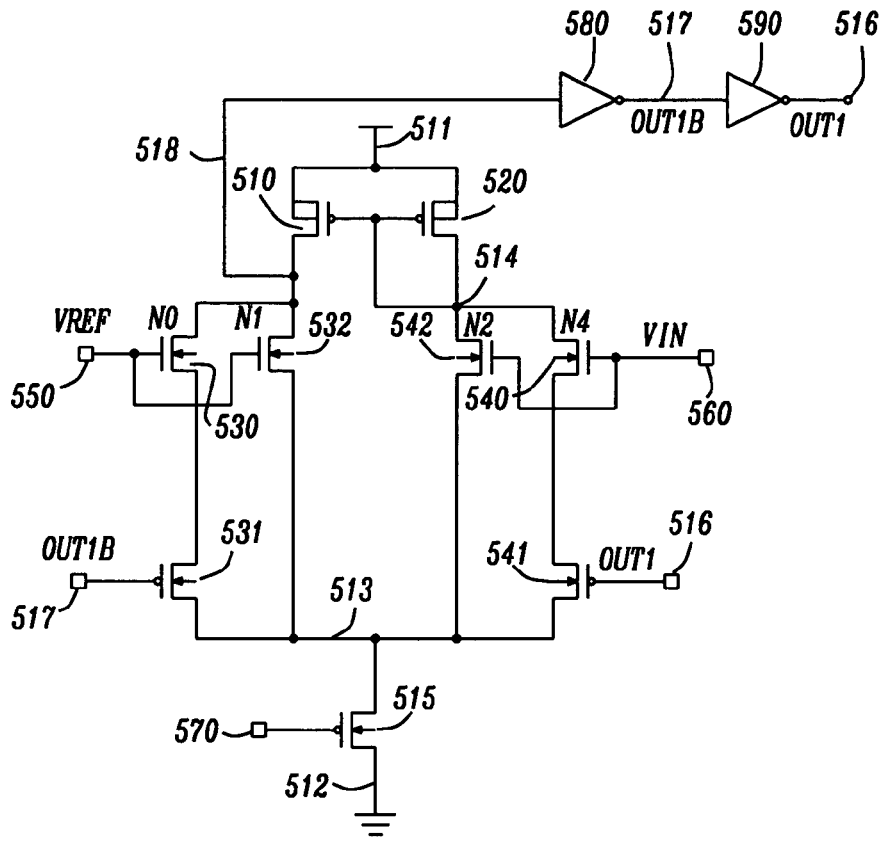
FIG. 2c shows a differential comparator circuit with hysteresis, which represents a second embodiment of this invention.

FIG. 2c shows a second embodiment of the comparator circuit of this invention. It is a differential comparator with hysteresis. Devices 510 and 520 are p-channel metal oxide semi-conductor field effect transistors (PMOS FETs). They are load devices with their sources and substrates connected to the power supply mode 511. The gates of devices 510 and 520 are connected in common to the drain 514 of device 520. The drain 518 of device 510 drives inverter 580. The output of inverter 580 is node OUT 1B (517). The output of inverter 580 feeds inverter 590, whose output is OUT1 (516). N-channel metal oxide semi conductor field effect transistors (NMOS FETs) 530 and 540 are the logic devices for the differential amplifier. The gate of device 530 is connected to a reference voltage, VREF, 550. The drain of device 530 is connected to node 518. The gate of 540 is connected to an input voltage, VIN 560. The drain of device 540 is connected to node 514. The source of device 530 is connected to the drain of device 531. The source of device 540 is connected to the drain of device 541. Device 515 is a current source whose current is specified by its device size and its gate voltage 570. The source of device 515 is connected to ground 512.

In FIG. 2c, NMOS FET device 531 has its drain connected to the source of device 530. Device 531 has its source connected to the drain of device 515 at node 513. The gate of device 531 is connected to node 517, which is the OUT 1B signal. NMOS FET device 541 has its drain connected to the source of device 540. Device 541 has its source connected to the drain of device 515 at node 513. The gate of device 541 is connected to node 516, which is the OUT1 signal.

Figure 2D:
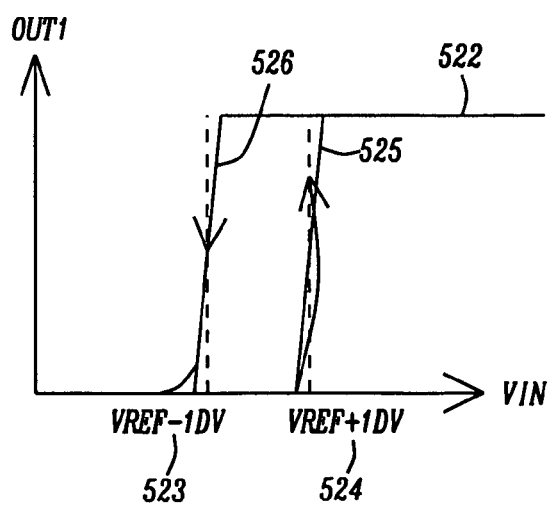
FIG. 2d shows an input vs. output transfer graph for the circuit of FIG. 2c.

FIG. 2d shows transfer function plot 522 with VIN vs. OUT1. Increasing VIN from zero, the output of the differential op any remains zero until VIN approaches VREF+dV (524). As VIN approaches VREF+dV (524), OUT1 begins to increase from zero. OUT1 continues to increase until VIN is slightly above VREF+dV (524). Then, OUT1 stops increasing and remains constant at a HIGH level.

Similarly, in FIG. 2d, as VIN decreases from some voltage level above VREF, OUT1 remains at a constant HIGH level. As VIN decreases and approaches VREF−dV (523), OUT1 decreases. OUT1 decreases to zero as VIN decreases to a voltage value just below VREF−dv (523). Then, as VIN decreases toward zero, OUT1 remains constant at zero volts as shown in FIG. 2d. This behavior shown in FIG. 2d demonstrates hysteresis.

The circuitry of FIG. 2c produces hysteresis. Initially, devices 530 and 531 are ON, causing node 518 to be LOW. Consequently, node OUT 1B would be HIGH at the output of inverter 580. Initially, node OUT1 (516) would be LOW as shown in the transfer graph in FIG. 2d. As seen in FIG. 2c, as VIN 560 increases toward VREF+dV, device 540 turns ON more fully. When VIN equals VREF+dV, the op amp comparator switches causing node 518 to go HIGH, OUT 1B (517) to go LOW and OUT1 (516) to go HIGH 525 as shown in the transfer plot 522 of FIG. 2d. Since OUT1 is HIGH, device 541 turns ON. When this happens, current is diverted from device 540. When VIN decreases, node OUT1 remains HIGH and OUT 1B remains LOW. Since OUT 1B is LOW, device 531 remains OFF, and current cannot flow through device 530. This allows current flow through parallel device 532. This is similar to the current diversion through resistor 232 in FIG. 2a. The voltage drop across parallel device 532 is dV. When the voltage on VIN approaches VREF−dV, the comparator begins to switch again. When VIN equals VREF−dV, the comparator switches causing node 518 to go LOW, OUT 1B (517) to go HIGH, and OUT1 (516) to go LOW 526 as shown in the transfer graph 522 of FIG. 2d. Since OUT1 is LOW, device 541 turns OFF, and current cannot flow through device 540. This allows current flow through parallel device 542. This is similar to the current diversion through resistor 242 in FIG. 2a.

Figure 3:
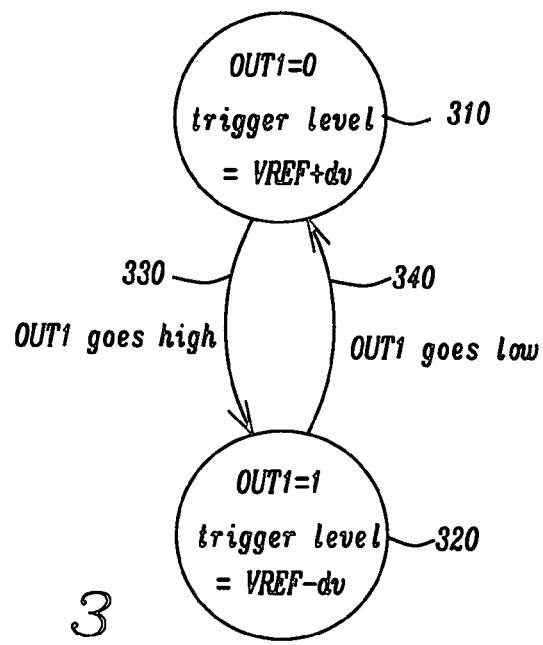
FIG. 3 shows a state diagram which illustrates the operation of the comparator circuit of this invention.

FIG. 3 shows a state diagram which illustrates the Schmitt trigger hysteresis character of this embodiment of the invention. In state 310, the trigger level is VREF+dV. When VIN=VREF+dV, there is a state transistion from state 310 to state 320, and OUT1 makes a transition from LOW to HIGH 330. In state 320, the trigger level is VREF−dV. When VIN=VREF−dV, there is a state transistion from state 320 to state 310, and OUT1 makes a transition from HIGH to LOW 340.

Figure 4:
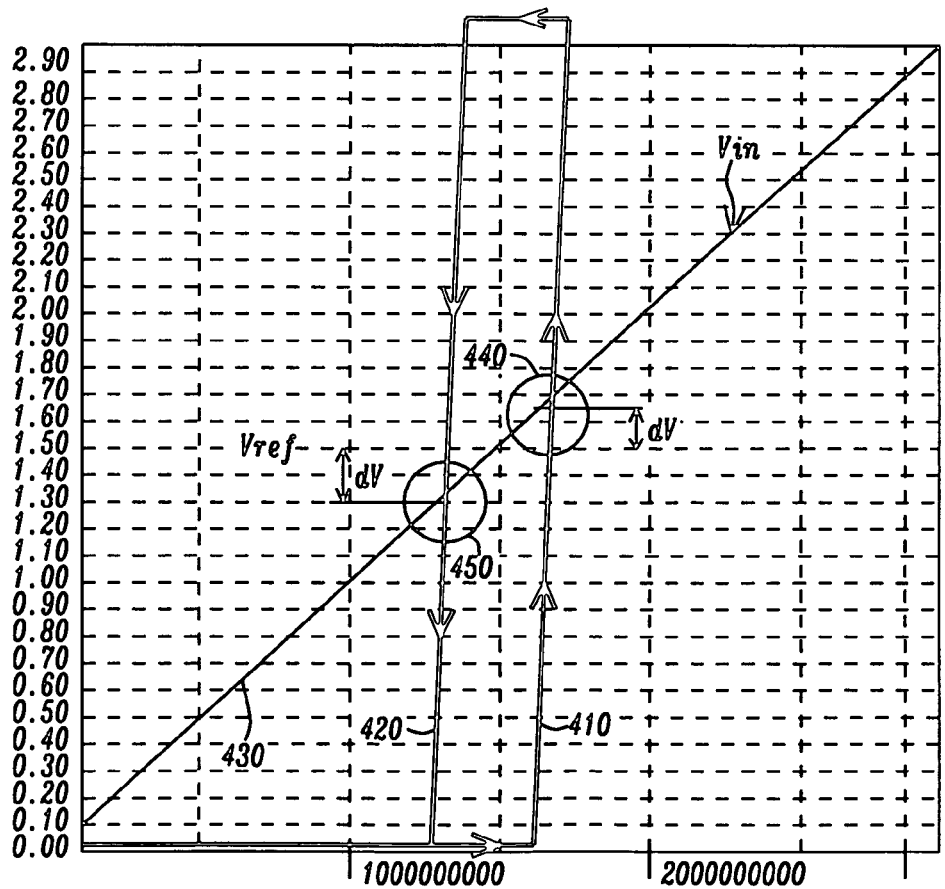

FIG. 4 shows the results of a computer simulation of a model of the circuit of FIG. 2a. Lines 410 and 420 illustrate the same VIN vs. OUT1 graph behavior shown in FIG. 2b. Line 410 is the same OUT1 transistion from LOW to HIGH illustrated by the 330 state transistion in FIG. 3. Line 420 is the same OUT1 transistion from HIGH to LOW illustrated by the 340 state transistion in FIG. 3. FIG. 4 also shows on the same axes, a plot of VIN 430 vs. VREF. When, VIN=VREF plus dV, the OUT1 graph switches from LOW to HIGH. When, VIN=VREF minus dV, the OUT1 graph switches from HIGH to LOW.

The advantage of the first embodiment of this invention is the simple and unique addition of the first and second parallel resistors 232, 242 which are used to provide the differential comparator with switching voltage offsets which result in the Schmitt trigger hysteresis character. A typical value for these resistors is 10 kilo ohms. The value of these two parallel resistors can be varied to produce a wider or narrower hysteresis loop. Typically, wider loops are necessary if there are large magnitude swings or instabilities in quantities such as temperature being measured by comparator circuitry. On the other hand, narrower loops are used if there are smaller magnitude variations or instabilities in quantities such as temperature being measured by the comparator circuitry. The second embodiment of this invention replaces parallel resistors 232 and 242 with parallel devices 532 and 542. These devices provide a flexible alternate way of providing switching voltage offsets.

While the invention has been described in terms of the preferred embodiments, those skilled in the art will recognize that various changes in form and details may be made without departing from the spirit and scope of the invention.

What is claimed is:

1. A comparator circuit with Schmitt trigger hysteresis character comprising:
   a current source which controls the magnitude of current flow through said comparator circuit,
   a first logic device which is turned ON by a reference voltage, and which when ON feeds current to said current source,
   a second logic device which is turned ON by a comparator input voltage, and which when ON allows current to flow to said current source,
   a first feedback device which is turned ON by a negative comparator output,
   a first parallel resistor which is connected in parallel to said first feedback device,
   a second feedback device which is turned ON by a positive comparator output,
   a second parallel resistor which is connected in parallel to said second feedback device,
   a first load device which is connected to said first feedback device, and
   a second load device which is connected to said second feedback device,
wherein said first and second parallel resistors are used to provide the differential comparator with switching voltage offsets which result in the Schmitt trigger hysteresis character.

2. The comparator circuit of claim 1 wherein said current source is an N-channel metal oxide semiconductor field effect transistor, NMOS FET, whose source is connected to ground, whose drain is connected to sources of said first logic device and said second logic device, and whose gate is connected to a bias voltage.

3. The comparator circuit of claim 1 wherein said first logic device is an NMOS FET whose gate is connected to a reference voltage, whose source is connected to said drain of said current source and whose drain is connected to a source of said first feedback device.

4. The comparator circuit of claim 1 wherein said second logic device is an NMOS FET whose gate is connected to said comparator input voltage, whose source is connected to said drain of said current source and whose drain is connected to a source of said second feedback device.

5. The comparator circuit of claim 1 wherein said first feedback device is an NMOS FET whose gate is connected to said negative comparator output, whose drain is connected to a drain of said first load device, and whose source is connected to said drain of said first logic device.

6. The comparator circuit of claim 1 wherein said first parallel resistor has one node connected to said drain of said first load device and whose other node is attached to said source of said first logic device.

7. The comparator circuit of claim 1 wherein said second feedback device is an NMOS FET whose gate is connected to said positive comparator output, whose drain is connected to a source of said second load device, and whose source is connected to said drain of said second logic device.

8. The comparator circuit of claim 1 wherein said second parallel resistor has one node connected to said source of said second load device, and whose other node is attached to said source of said second logic device.

9. The comparator circuit of claim 1 wherein said first load device is a p-channel metal oxide semiconductor field effect transistor, PMOS FET, whose gate is attached to a gate and to a drain of said second load device, whose source is connected to a power supply voltage, and whose drain is connected to said drain of said first feedback device.

10. The comparator circuit of claim 1 wherein said second load device is a PMOS FET whose gate is attached to said drain of said second load device and to said gate of said first load device, and whose drain is connected to said drain of said second feedback device, and whose source is connected to said power supply voltage.

11. A method for providing a comparator circuit with Schmitt trigger hysteresis character comprising the steps of:
   providing a current source which controls the magnitude of current flow through said comparator circuit,
   providing a first logic device which is turned ON by a reference voltage, and which when ON feeds current to said current source,
   providing a second logic device which is turned ON by a comparator input voltage, and which when ON allows current to flow to said current source,
   providing a first feedback device which is turned ON by a negative comparator output,
   providing a first parallel resistor which is connected in parallel to said first feedback device,
   providing a second feedback device which is turned ON by a positive comparator output,
   providing a second parallel resistor which is connected in parallel to said second feedback device,
   providing a first load device which is connected to said first feedback device, and providing a second load device which is connected to said second feedback device, wherein said first and second parallel resistors are used to provide the differential comparator with switching voltage offsets which result in the Schmitt trigger hysteresis character.

12. The method for providing a comparator circuit of claim 11 wherein said current source is an N-channel metal oxide semiconductor field effect transistor, NMOS FET, whose source is connected to ground, whose drain is connected to sources of said first logic device and said second logic device, and whose gate is connected to a bias voltage.

13. The method for providing a comparator circuit of claim 11 wherein said first logic device is an NMOS FET whose gate is connected to a reference voltage, whose source is connected to said drain of said current source and whose drain is connected to a source of said first feedback device.

14. The method for providing a comparator circuit of claim 11 wherein said second logic device is an NMOS FET whose gate is connected to said comparator input voltage, whose source is connected to said drain of said current source and whose drain is connected to a source of said second feedback device.

15. The method for providing a comparator circuit of claim 11 wherein said first feedback device is an NMOS FET whose gate is connected to said negative comparator output, whose drain is connected to a drain of said first load device, and whose source is connected to said drain of said first logic device.

16. The method for providing a comparator circuit of claim 11 wherein said first parallel resistor has one node connected to said drain of said first load device and whose other node is attached to said source of said first logic device.

17. The method for providing a comparator circuit of claim 11 wherein said second feedback device is an NMOS FET whose gate is connected to said positive comparator output, whose drain is connected to a source of said second load device, and whose source is connected to said drain of said second logic device.

18. The method for providing a comparator circuit of claim 11 wherein said second parallel resistor has one node connected to said source of said second load device, and whose other node is attached to said source of said second logic device.

19. The method for providing a comparator circuit of claim 11 wherein said first load device is a p-channel metal oxide semiconductor field effect transistor, PMOS FET, whose gate is attached to a gate and to a drain of said second load device, whose source is connected to a power supply voltage, and whose drain is connected to said drain of said first feedback device.

20. The method for providing a comparator circuit of claim 11 wherein said second load device is a PMOS FET whose gate is attached to said drain of said second load device and to said gate of said first load device, and whose drain is connected to said drain of said second feedback device, and whose source is connected to said power supply voltage.

21. A comparator circuit with Schmitt trigger hysteresis character comprising:

a current source which controls the magnitude of current flow through said comparator circuit, a first logic device which is turned ON by a reference voltage, and which when ON feeds current to said current source, a second logic device which is turned ON by a comparator input voltage, and which when ON allows current to flow to said current source, a first feedback device which is turned ON by a negative comparator output, a first parallel device which is connected in parallel to said first feedback device, a second feedback device which is turned ON by a positive comparator output, a second parallel device which is connected in parallel to said second feedback device, a first load device which is connected to said first feedback device, and a second load device which is connected to said second feedback device, wherein said first and second parallel devices are used to provide the differential comparator with switching voltage offsets which result in the Schmitt trigger hysteresis character.

22. The comparator circuit of claim 21 wherein said first parallel device has its drain connected to said drain of said first load device, and whose source is attached to said drain of said current source.

23. The comparator circuit of claim 21 wherein said second parallel device has its drain connected to said drain of said second load device, and whose source is attached to said drain of said current source.

24. A method for providing a comparator circuit with Schmitt trigger hysteresis character comprising the steps of:

providing a current source which controls the magnitude of current flow through said comparator circuit, providing a first logic device which is turned ON by a reference voltage, and which when ON feeds current to said current source, providing a second logic device which is turned ON by a comparator input voltage, and which when ON allows current to flow to said current source, providing a first feedback device which is turned ON by a negative comparator output, providing a first parallel device which is connected in parallel to said first feedback device, providing a second feedback device which is turned ON by a positive comparator output, providing a second parallel device which is connected in parallel to said second feedback device, providing a first load device which is connected to said first feedback device, and providing a second load device which is connected to said second feedback device, wherein said first and second parallel devices are used to provide the differential comparator with switching voltage offsets which result in the Schmitt trigger hysteresis character.

25. The method for providing a comparator circuit of claim 24 wherein said first parallel device has its drain connected to said drain of said first load device, and whose source is attached to said drain of said current source.

26. The method for providing a comparator circuit of claim 24 wherein said second parallel device has its drain connected to said drain of said second load device, and whose source is attached to said drain of said current source.

* * * * *